(12) United States Patent
Tatsumi

(10) Patent No.: US 9,276,567 B2
(45) Date of Patent: Mar. 1, 2016

(54) DETECTION CIRCUIT FOR DETECTING SIGNAL AMPLITUDE

(71) Applicant: SUMITOMO ELECTRIC INDUSTRIES, LTD., Osaka-shi, Osaka (JP)

(72) Inventor: Taizo Tatsumi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/493,739

(22) Filed: Sep. 23, 2014

(65) Prior Publication Data

US 2015/0084674 A1    Mar. 26, 2015

(30) Foreign Application Priority Data

Sep. 24, 2013    (JP) ................................ 2013-196912

(51) Int. Cl.
*G01R 19/00*    (2006.01)
*H03K 5/125*    (2006.01)

(52) U.S. Cl.
CPC ..................... *H03K 5/125* (2013.01)

(58) Field of Classification Search
None
See application file for complete search history.

(56) References Cited

U.S. PATENT DOCUMENTS

| | | | |
|---|---|---|---|
| 6,191,621 B1* | 2/2001 | Ota | G01R 19/04 327/58 |
| 2011/0115525 A1* | 5/2011 | Presti | H03K 5/1532 327/58 |

FOREIGN PATENT DOCUMENTS

JP    2012-215662 A1    11/2012

OTHER PUBLICATIONS

Kucharski et al, "*Jitter Considerations in the Design of a 10-Gb/s Automatic Gain Control Amplifier*", IEEE Transactions On Microwave Theory and Techniques, vol. 53, No. 2, Feb. 2005.

* cited by examiner

*Primary Examiner* — Long Nguyen
(74) *Attorney, Agent, or Firm* — Smith, Gambrell & Russell LLP

(57) ABSTRACT

A detection circuit includes a differential circuit including a pair of differential transistors configured to receive the input differential signal and a first current source, the pair of the differential transistors having a common output terminal connected to the first current source, a hold capacitor connected between the common output terminal and a reference potential for generating a hold potential, a level sensing circuit configured to sense a voltage level of the input differential signal and output a switching signal, and a switch configured to receive the switching signal and electrically connect the common output terminal and a second current source when the switching signal exceeds a threshold level being lower than the hold potential by a predetermined amount, and electrically disconnect the common output terminal and the second current source when the switching signal stays lower than the threshold level.

7 Claims, 9 Drawing Sheets

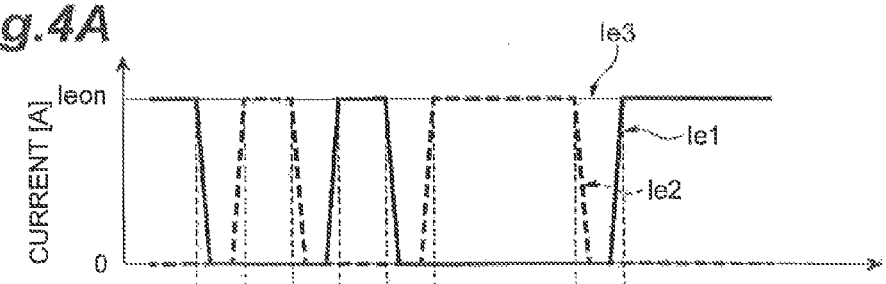
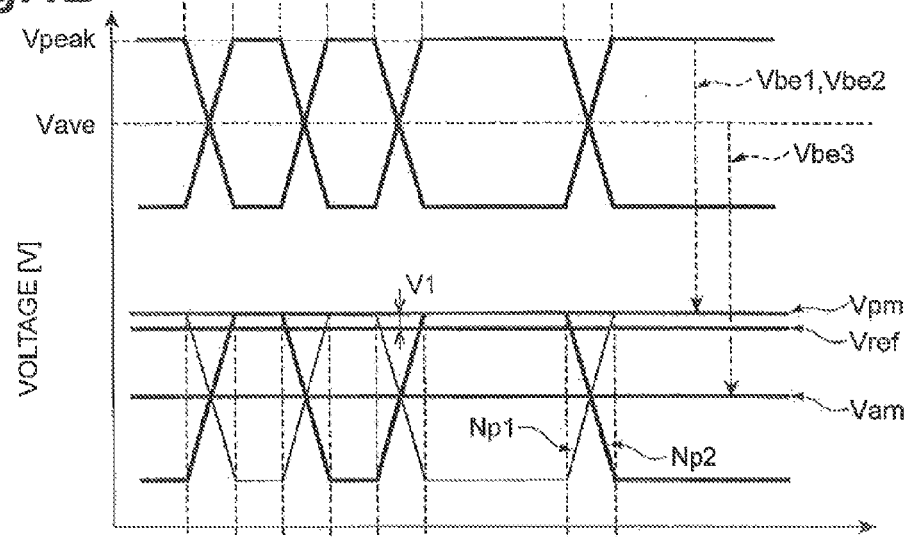
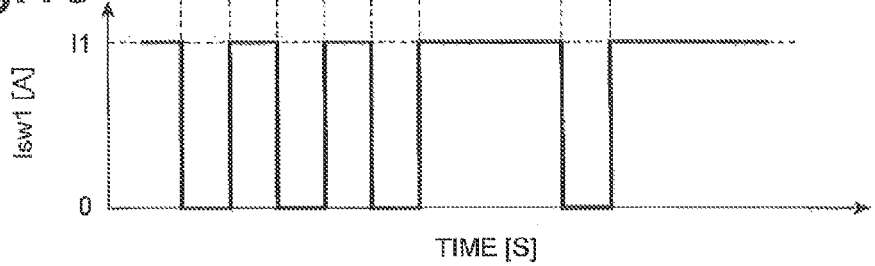

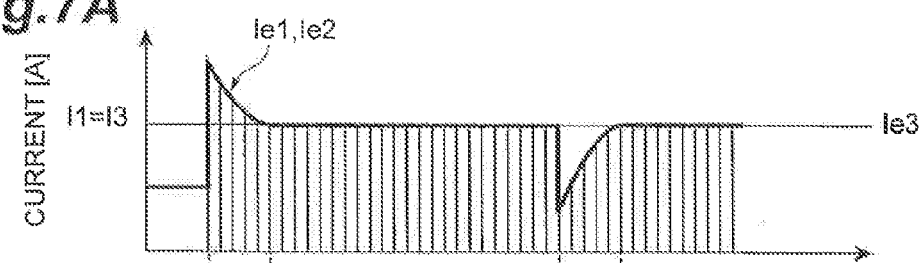
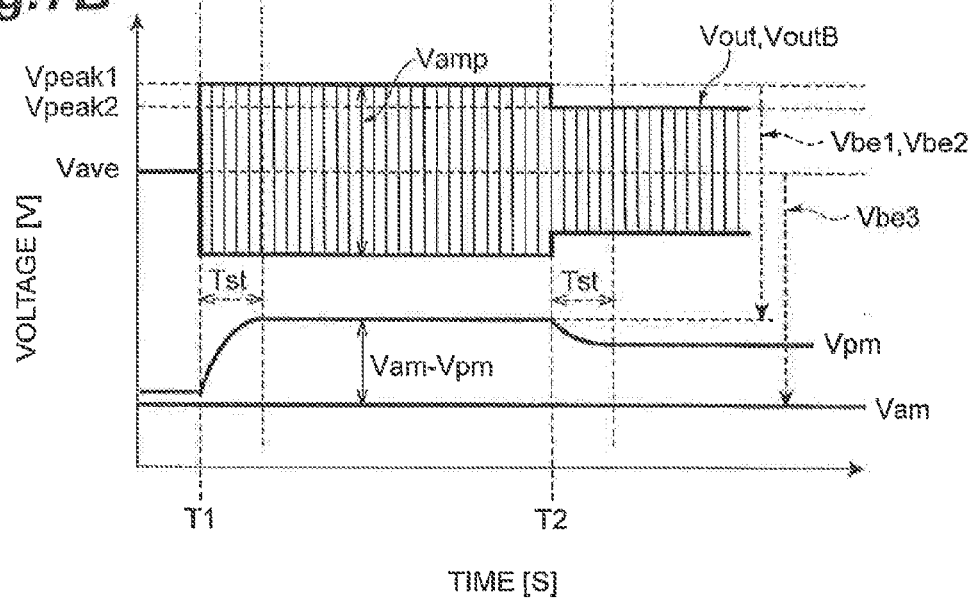

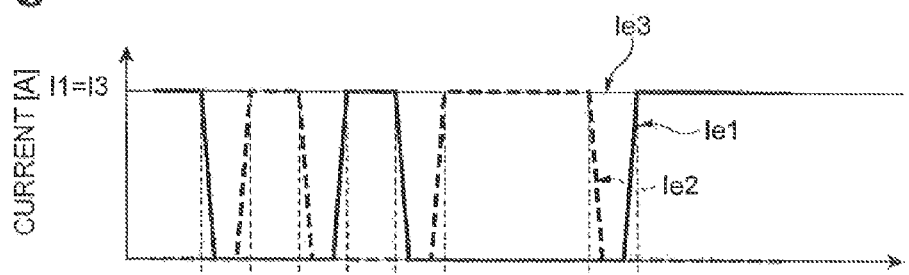
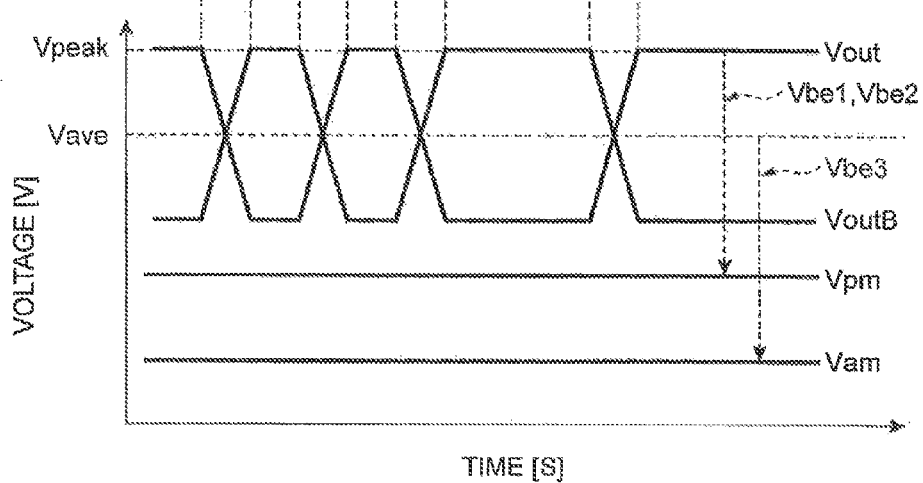

→ ON
→ OFF

DETECTION CIRCUIT FOR DETECTING SIGNAL AMPLITUDE

BACKGROUND OF THE INVENTION

1. Field of the Invention

The present invention relates to a detection circuit for detecting signal amplitude.

2. Related Background of the Invention

An optical transmitter module used for an optical communication is configured by a light source such as a laser diode, an optical modulator such as an electro-absorption modulator (EAM) or a Mach-Zehnder modulator (MZM), and a modulator driving circuit. In addition, a detection circuit for detecting an amplitude of a driving signal to drive the optical modulator is sometimes added to the modulator driving circuit. With respect to the detection circuit used in the optical transmitter module for high-speed communication of 32 Gbps or 40 Gbps, high-speed detection is required because a communication signal has a high frequency component up to approximately 10 GHz. In addition, in a multi-level modulation method such as pulse amplitude modulation 4 (PAM4) or 16 quadrature amplitude modulation (16 QAM), a more precise detection is required as compared with a conventional on-off-keying method.

As an example of the detection circuit, a configuration described in patent document 1: Japanese Unexamined Patent Application Publication No. 2012-215662 described below is known. The amplitude detection circuit includes a peak detection circuit and an averaging circuit, and an amplitude is found as the difference between outputs thereof. The peak detection circuit is mainly configured by an operational amplifier and a peak hold circuit, and when a frequency band of a detection circuit is set to be 10 GHz or more, the detection circuit needs an operational amplifier operational with a frequency greater than 10 GHz. In addition, since an input offset value of the operational amplifier causes an error of a peak detection value, the gain of the operational amplifier is required to be maintained to be high up to a high frequency in order to decrease the error. Here, if an operation speed of the modulator driving circuit is 40 Gbps, an frequency band thereof is approximately 30 GHz. If an operational amplifier with a high gain at 10 GHz or more is used in the peak detection circuit using the same transistors, power consumption thereof increases to a large value of approximately 1/10 to 1/3 of the modulator driving circuit. Therefore, the peak detection circuit described in the patent document 1 described above is not appropriate for peak detection of a signal with a high frequency.

In addition, as another configuration of the amplitude detection circuit, the configuration described in non-patent document 1: "Daniel Kucharski, 'Jitter Considerations in the Design of a 10-Gb/s Automatic Gain Control Amplifier', IEEE Transactions of Microwave Theory and Techniques, Vol. 53, No. 2, February 2005" is known. In the configuration, since a peak detection circuit is configured only by a peak hold circuit, not by any operational amplifier, it is possible to handle a high frequency signal with low power consumption.

In the detection circuit described in the non-patent document 1 described above, an error of a detected amplitude is increased depending on a signal waveform. That is, a ratio of on-time when an input signal is close to a peak value of it with respect to off-time when the input signal is lower away from the peak value becomes small, and thus an error of the detected amplitude tends to be degraded.

Therefore, an object of the present invention is to solve such problems, and to provide a detection circuit for detecting signal amplitude which can accurately detect an amplitude of an input signal with a high frequency.

SUMMARY OF THE INVENTION

In order to solve the above problems, a detection circuit according to an aspect of the present invention configured to detect a peak value of an input differential signal and detect an amplitude of the input differential signal based on the peak value, includes a differential circuit including a pair of differential transistors configured to receive the input differential signal and a first current source, the pair of the differential transistors having a common output terminal connected to the first current source, a hold capacitor connected between the common output terminal and a reference potential for generating a hold potential corresponding to the peak value, a level sensing circuit configured to sense a voltage level of the input differential signal and output a switching signal based on the voltage level; and a switch configured to receive the switching signal and electrically connect the common output terminal and a second current source when the switching signal exceeds a threshold level being lower than the hold potential by a predetermined amount, and electrically disconnect the common output terminal and the second current source when the switching signal stays lower than the threshold level.

Alternatively, a detection circuit according to another aspect of the present invention configured to detect a peak value of an input signal and detect an amplitude of the input signal based on the peak value, includes a transistor configured to receive the input signal and output a current from an output terminal to a parallel circuit configured with a first current source and a hold capacitor, a level sensing circuit configured to sense a voltage level of the input signal and output a switching signal based on the voltage level, and a switch configured to receive the switching signal and electrically connect the output terminal and a second current source when the switching signal exceeds a threshold level being lower than the hold potential by a predetermined amount, and electrically disconnect the common output terminal and the second current source when the switching signal stays lower than the threshold level.

BRIEF DESCRIPTION OF THE DRAWINGS

The foregoing and other purposes, aspects and advantages will be better understood from the following detailed description of a preferred embodiment of the invention with reference to the drawings, in which:

FIG. 4A is a diagram illustrating a waveform of emitter currents Ie1, Ie2, and Ie3 of each of transistors 21a, 21b, and 21c of the amplitude detection circuit 11.

FIG. 4B is a diagram illustrating a waveform of differential signal Vout and VoutB, and detection signals Vam and Vpm of the amplitude detection circuit 11.

FIG. 4C is a diagram illustrating a waveform of a current value Isw1 which is supplied from a current source 25b to a differential circuit 23 in the amplitude detection circuit 11.

FIG. 7A is a diagram illustrating a waveform of emitter currents Ie1, Ie2, and Ie3 of each of transistors 21*a*, 21*b*, and 21*c* of the amplitude detection circuit 911.

FIG. 7B is a diagram illustrating a waveform of differential signal Vout and VoutB, and detection signals Vam and Vpm of the amplitude detection circuit 911.

FIG. 8A is a diagram illustrating a waveform in a short time of the emitter currents Ie1, Ie2, and Ie3 of each of the transistors 21*a*, 21*b*, and 21*c* of the amplitude detection circuit 911.

FIG. 8B is a diagram illustrating a waveform in a short time of the differential signal Vout and VoutB, and the detection signals Vam and Vpm of the amplitude detection circuit 911.

DESCRIPTION OF THE PREFERRED EMBODIMENTS

Figure 1:
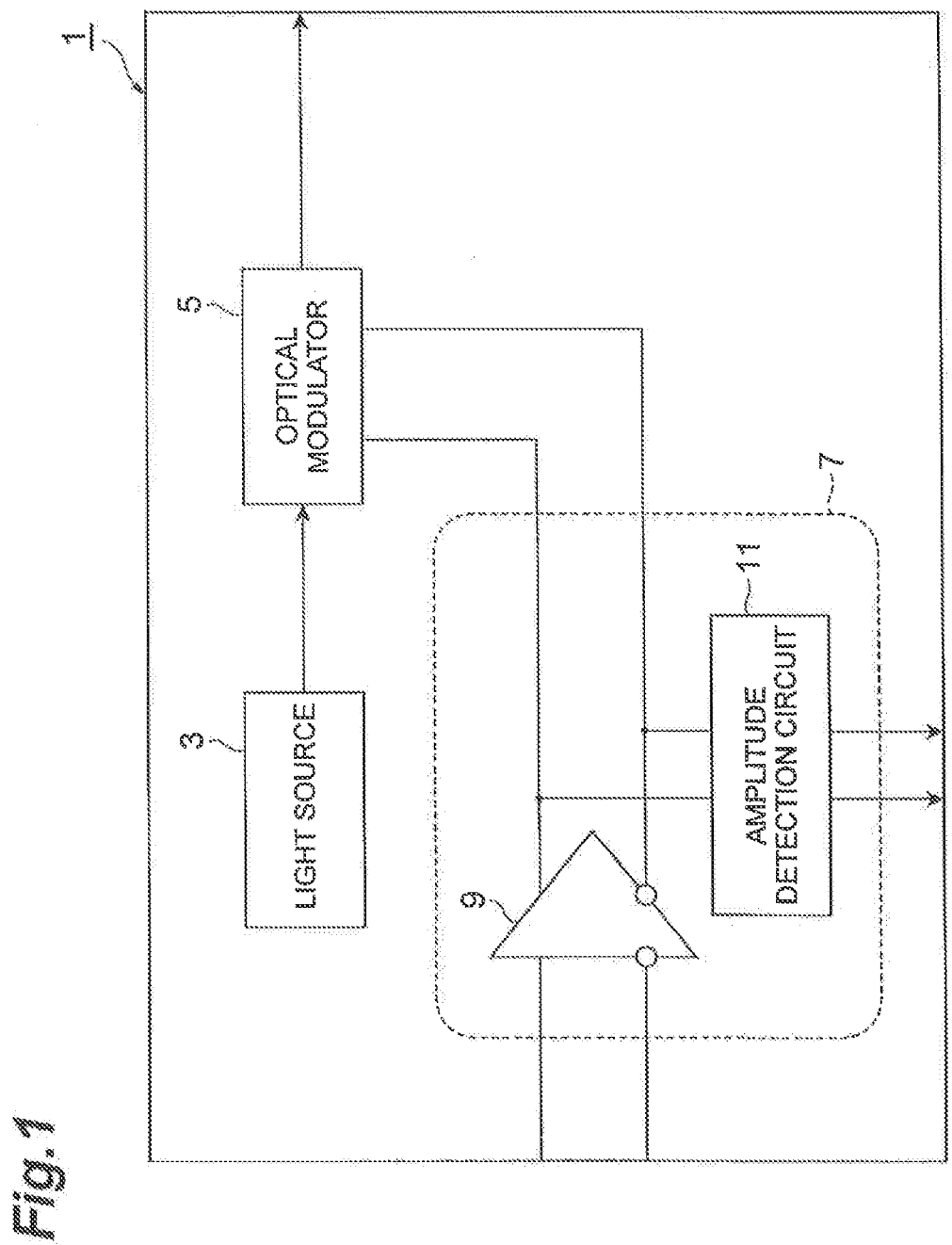
FIG. 1 is a block diagram illustrating a schematic configuration of an optical transmitter module according to a preferred embodiment of the present invention.

A detection circuit according to an aspect of the present invention configured to detect a peak value of an input differential signal and detect an amplitude of the input differential signal based on the peak value, includes a differential circuit including a pair of differential transistors configured to receive the input differential signal and a first current source, the pair of the differential transistors having a common output terminal connected to the first current source, a hold capacitor connected between the common output terminal and a reference potential for generating a hold potential corresponding to the peak value, a level sensing circuit configured to sense a voltage level of the input differential signal and output a switching signal based on the voltage level; and a switch configured to receive the switching signal and electrically connect the common output terminal and a second current source when the switching signal exceeds a threshold level being lower than the hold potential by a predetermined amount, and electrically disconnect the common output terminal and the second current source when the switching signal stays lower than the threshold level.

According to the detection circuit, with a configuration in which the hold capacitor is connected to the output terminal of the differential circuit including a pair of the differential transistors which is driven by the first current source, the hold potential corresponding to the peak value of the input differential signal is generated by the hold capacitor. Furthermore, only while the level of the input differential signal rises near the hold potential, by means of the switch, the second current source is connected to the output terminals of a pair of the differential transistors in parallel to the hold capacitor. Thus, without being influenced by the waveform of the input differential signal, it is possible to maintain the hold potential close to the peak value of the input differential signal. As a result, it is possible to accurately detect the amplitude of the input differential signal with a high frequency.

Here, it is preferable that the detection circuit further include an averaging circuit configured to sense an average value of the input differential signal, in which an amplitude of the input differential signal is detected by a difference between the hold potential and the average value. If such a configuration is employed, influence of the offset of the input differential signal is also added, and thereby the amplitude of the input differential signal can be accurately detected.

In addition, it is preferable that in the detection circuit, a current source for driving the averaging circuit is configured to drain the same current value as a current value of the second current source. In this case, it is possible to detect the average value of the input differential signal in the same condition as that of the peak value of the input differential signal. As a result, it is possible to more accurately detect the amplitude of the input differential signal.

Alternatively, a detection circuit according to another aspect of the present invention configured to detect a peak value of an input signal and detect an amplitude of the input signal based on the peak value, includes a transistor configured to receive the input signal and output a current from an output terminal to a parallel circuit configured with a first current source and a hold capacitor, a level sensing circuit configured to sense a voltage level of the input signal and output a switching signal based on the voltage level, and a switch configured to receive the switching signal and electrically connect the output terminal and a second current source when the switching signal exceeds a threshold level being lower than the hold potential by a predetermined amount, and electrically disconnect the common output terminal and the second current source when the switching signal stays lower than the threshold level.

According to the signal amplitude detection circuit, with a configuration in which the hold capacitor is connected to the output terminal of the transistor which is driven by the first current source, the hold potential corresponding to the peak value of the input signal is generated by the hold capacitor. Furthermore, only while the level of the input signal rises near the hold potential, by means of the switch, the second current source is connected to the output terminal of the transistor in parallel to the hold capacitor. Thus, without being influenced by the waveform of the input signal, it is possible to maintain the hold potential close to the peak value of the input signal. As a result, it is possible to accurately detect the amplitude of the input signal with a high frequency.

Here, it is preferable that in the detection circuit, a current value of the first current source be smaller than a current value of the second current source. According to this, even if the amplitude of the input signal varies, it is possible to accurately detect the amplitude of the input signal.

In addition, it is preferable that the detection circuit further include a comparator configured to compare the voltage level of the input signal with the threshold level and output the switching signal. If such a configuration is employed, it is possible to accurately detect the amplitude of the input signal with a simple circuit configuration.

Hereinafter, an embodiment of a detection circuit according to the present invention will be described in detail with reference to the attached drawings. In addition, in the description of the drawings, the same symbols and reference numerals are given to the same elements, and repeating descriptions will be omitted.

FIG. 1 is a block diagram illustrating a schematic configuration of an optical transmitter module according to a preferred embodiment of the present invention. The optical transmitter module 1 is configured with a light source 3 such as a laser diode, an optical modulator 5 which modulates a continuous wave (CW) generated by the light source and outputs the modulated continuous wave, and a modulator driving circuit 7 which drives the optical modulator 5. The modulator driving circuit 7 includes a differential amplifier 9 which receives input signals, which are complementary to each other, from an external device and amplifies the input signals as two driving signals, and an amplitude detection circuit 11 which is connected to two outputs of the differential amplifier 9 and detects the amplitudes of the two driving signals. A detection signal of the amplitude generated by the amplitude detection circuit 11 is output to an external device.

Figure 2:
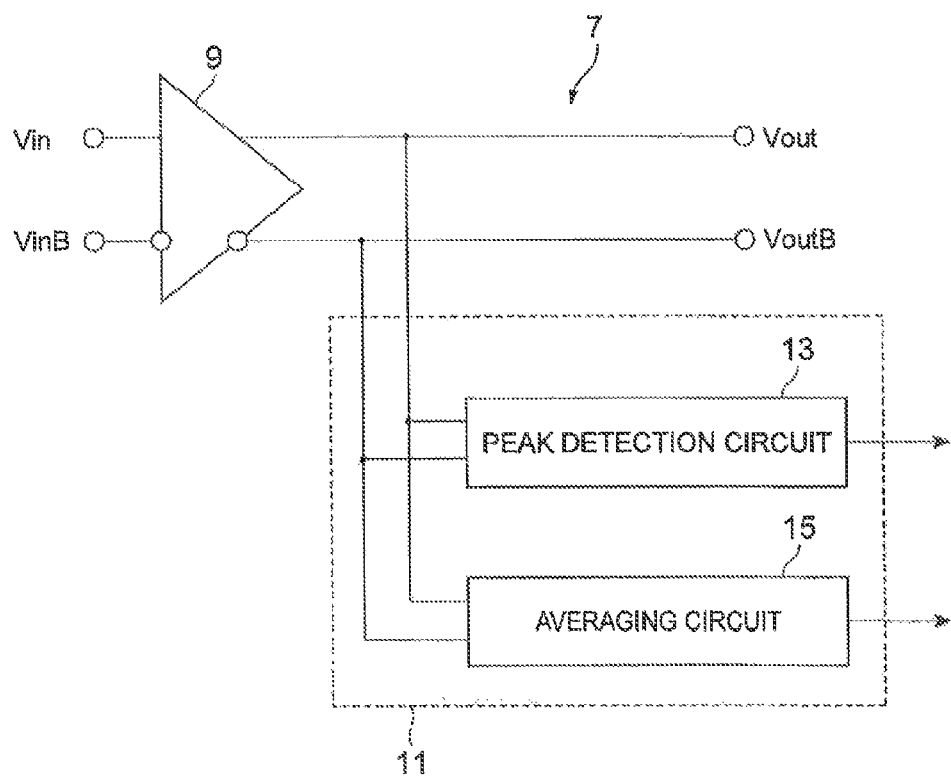
FIG. 2 is a block diagram illustrating a detailed configuration of a modulator driving circuit 7 of FIG. 1.

In FIG. 2, a specific configuration of the modulator driving circuit 7 is illustrated. In the differential amplifier 9 which is included in the modulator driving circuit 7, an input signal Vin is input to a non-inverting input terminal thereof, and an input signal VinB which is a signal complementary to the input signal Vin is input to an inverting input terminal thereof. Then, the differential amplifier 9 amplifies the input signals Vin and VinB, and outputs two driving signals (differential signal) Vout and VoutB. In addition, the amplitude detection circuit 11 included in the modulator driving circuit 7 is configured to include a peak detection circuit 13 and an averaging circuit 15. The peak detection circuit 13 detects peak values of the differential signal Vout and VoutB. The averaging circuit 15 senses average values of the differential signal Vout and VoutB. Furthermore, the amplitude detection circuit 11 generates difference values between the peak values detected by the peak detection circuit 13 and the average values detected by the averaging circuit 15 respectively. The amplitude detection circuit 11 detects the amplitudes of the differential signal Vout and VoutB based on the difference values, and outputs the detected amplitudes.

Figure 3:
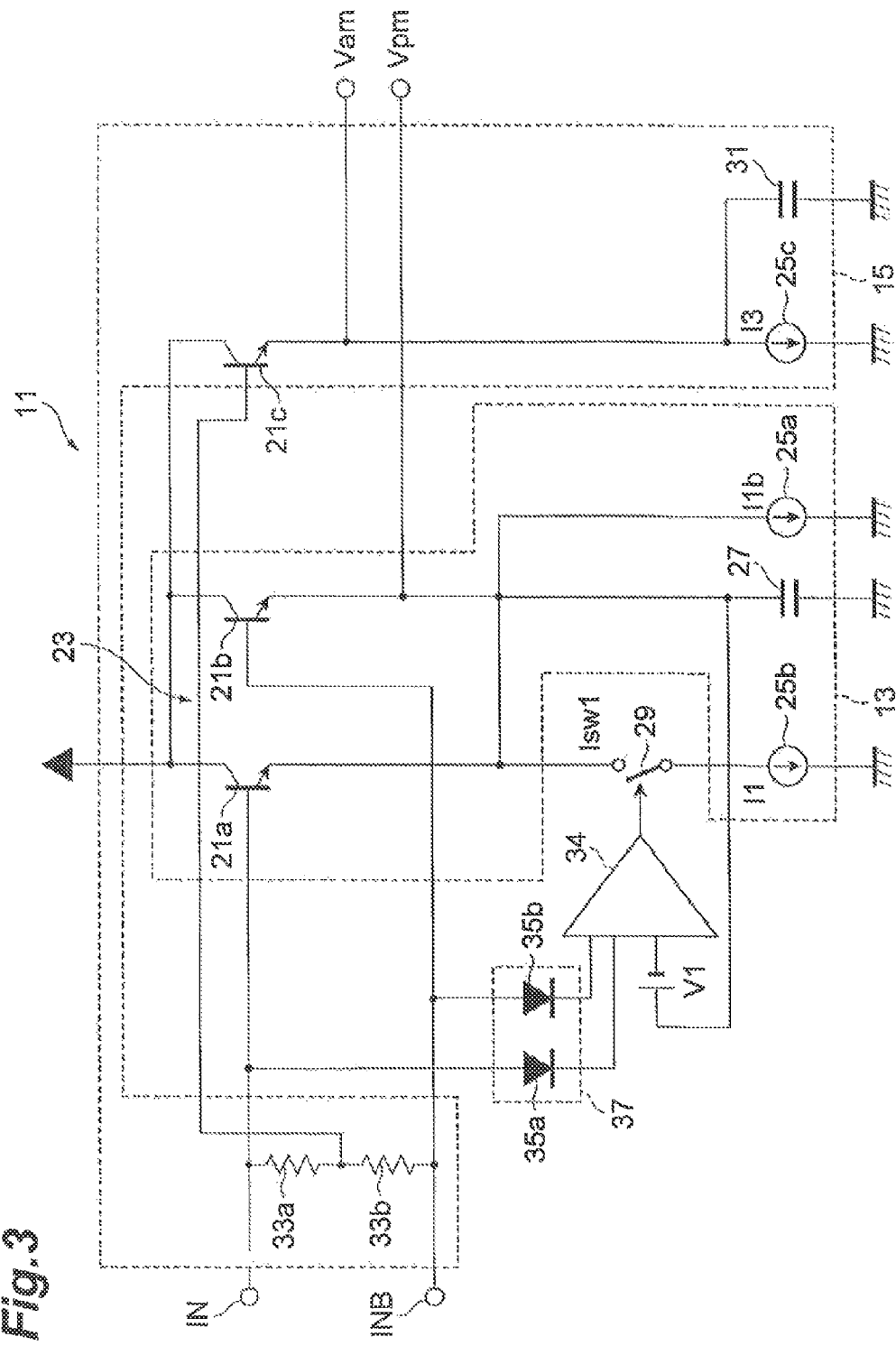
FIG. 3 is a circuit diagram of an amplitude detection circuit 11 of FIG. 1.

Hereinafter, with reference to FIG. 3, a circuit configuration and a function of the amplitude detection circuit 11 will be described. FIG. 3 is a circuit diagram of the amplitude detection circuit 11.

The peak detection circuit 13 which configures the amplitude detection circuit 11 includes a differential circuit 23, a parallel circuit which is configured with a current source 25a and a hold capacitor 27, and a current source 25b. The differential circuit 23 includes two transistors 21a and 21b which are a pair of differential transistors connected as an emitter follower. The parallel circuit are connected in common to emitter terminals (common output terminal) of the transistors 21a and 21b. The current source 25b is connected in common to the emitter terminals of the transistors 21a and 21b via a switch 29 which will be described later. The peak detection circuit 13 with such a configuration does not include an operational amplifier. A signal band which can be detected by the circuit 13 is determined only by a band of an emitter follower of the transistors 21a and 21b. Thus, it is easy to obtain a wide band, and it is possible to set the signal band even in a frequency of 10 GHz or greater.

The transistors 21a and 21b have control terminals (base terminals) which are respectively connected to input terminals IN and INB, and respectively receive the differential signal Vout and VoutB from the input terminals IN and INB. If a potential of the input terminal IN is at a high level, the transistor 21a turns on, and functions as a peak hold circuit. If a potential of the input terminal INB is at a high level, the transistor 21b turns on, and functions as the peak hold circuit. The transistors 21a and 21b also function as diodes for charging the peak hold circuit.

When either of the transistors 21a and 21b turns on, the current source 25b is a current source which supplies an emitter current. For example, the current value I1 of the current source 25b is set to approximately 10 μA to 100 μA. The current source 25a is a current source for discharging the hold capacitor 27 when the amplitudes of the differential signal Vout and VoutB vary from a large state to a small state.

A current value I1b thereof is set to a small value with approximately 1/10 of a current value I1 of the current source 25b.

The hold capacitor 27 is charged by emitter currents of the transistors 21a and 21b, thereby generating hold potentials corresponding to the peak values of the differential signal Vout and VoutB. For example, a capacitance of the hold capacitor 27 is set to 1 pF to 1 μF. The hold potential generated by the hold capacitor 27 is output as a peak detection signal Vpm.

The averaging circuit 15 which configures the amplitude detection circuit 11 is a level shift circuit with respect to average voltages of the differential signal Vout and VoutB. The averaging circuit 15 includes a transistor 21c, a parallel circuit which is configured by a current source 25c and a capacitor 31, and resistors 33a and 33b. The parallel circuit is connected to the emitter terminal of the transistor 21c. The resistors 33a and 33b are connected in series between the input terminals IN and INB.

The transistor 21c has a base terminal which is connected between the two resistors 33a and 33b, and receives an average voltage of the differential signal Vout and VoutB. The transistor 21c receives an emitter current which is supplied by the current source 25c, thereby generating an average detection signal Vam corresponding to the average value of the differential signal Vout and VoutB and outputting the average detection signal Vam to the emitter terminal. The capacitor 31 is an element for removing noise at the time of average detection, and is set to a capacitance of approximately 1 pF to 10 pF.

A current value I3 of the current source 25c is set in such a manner that a base-emitter voltage Vbe of the transistor 21c is equal to a voltage Vbe of the transistors 21a and 21b when these transistors 21a and 21b turn on. Due to this, when the amplitudes of the differential signal Vout and VoutB are detected based on a difference between the peak detection signal Vpm and the average detection signal Vam, the voltage Vbe is cancelled. Thereby, it is possible to improve accuracy of amplitude detection. That is, a ratio of the emitter sizes of the transistors 21a and 21b with respect to the current value I1 of the current source 25b is set so as to be the same as a ratio of the emitter size of the transistor 21c with respect to the current value I3 of the current source 25c. It is preferable that the emitter sizes of the transistors 21a, 21b, and 21c be set so as to be the same, and the current value I3 of the current source 25c and the current value I1 of the current source 25b be set so as to be the same.

The amplitude detection circuit 11 further includes a switch 29, a comparator 34, and a level sensing circuit 37. The switch 29 is connected between the emitter terminals of the transistors 21a and 21b and the current source 25b. A level sensing circuit 37 includes two diodes 35a and 35b.

Each of the diodes 35a and 35b respectively has an anode terminal connected to the input terminals IN and INB. Each of the diodes 35a and 35b is a level shift diode which detects the levels of the differential signal Vout and VoutB. That is, the diodes 35a and 35b generate detection voltages corresponding to the levels of the differential signal Vout and VoutB, respectively, at cathode terminals thereof. Amounts of potential shift generated by the diodes 35a and 35b are set so as to be equal to amounts of potential shift when the transistors 21a and 21b turn on.

Two detection voltages from the diodes 35a and 35b, and a reference voltage Vref in which a negative voltage −V1 is added to the peak detection signal Vpm, are input to the comparator 34. The comparator 34 compares the two detection voltages with the reference voltage Vref=Vpm−V1. In detail, the comparator 34 turns on the switch 29 (connected), while either of the two detection signals exceeds the voltage Vref which is a lower voltage than the peak detection signal Vpm by a predetermined voltage V1. On the other hand, the comparator 34 turns off the switch 29 (disconnected), during the time other than that. The predetermined voltage V1 is set to a small value of approximately 10 mV to 100 mV.

The operation and effects of the amplitude detection circuit 11 according to the present embodiment will be described in comparison with a comparative example.

Figure 6:
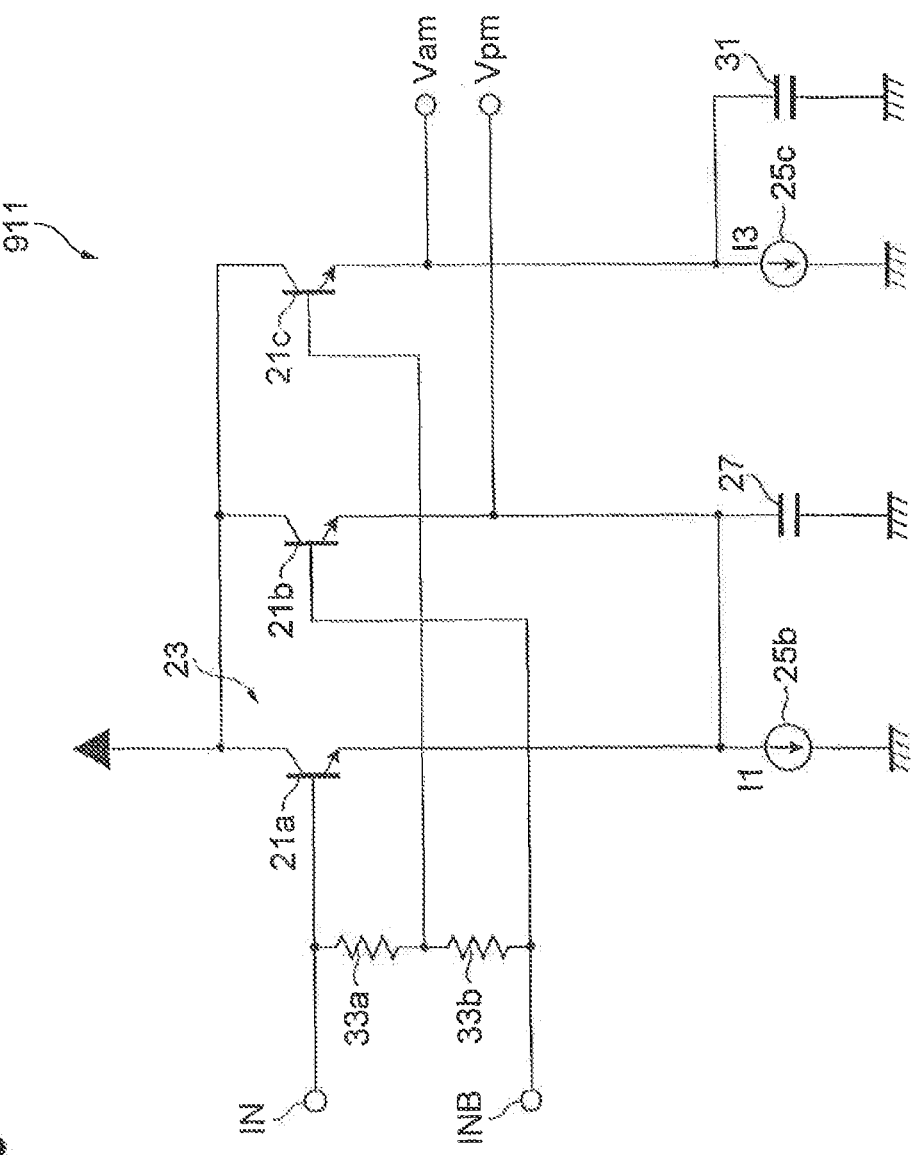
FIG. 6 is a circuit diagram of an amplitude detection circuit 911 according to a comparative example.

FIG. 6 illustrates a configuration of an amplitude detection circuit 911 of a comparative example. The amplitude detection circuit 911 illustrated in FIG. 6 is different from the amplitude detection circuit 11 according to the present embodiment in that the amplitude detection circuit 911 has only the current source 25b as a current source which supplies a current to the differential circuit 23 and does not have the switch 29, the comparator 34, and the level sensing circuit 37.

FIG. 7A, 7B illustrate an operation state of the amplitude detection circuit 911, FIG. 7A illustrates a waveform of emitter currents Ie1, Ie2, and Ie3 of each of transistors 21a, 21b, and 21c of the amplitude detection circuit 911, and FIG. 7B illustrates a waveform of differential signal Vout and VoutB, and detection signals Vain and Vpm.

As illustrated in FIGS. 7A and 7B, if a signal of an amplitude Vamp is input to input terminals IN and INB at time T1, the emitter currents Ie1 and Ie2 at the time of turning on are increased to be greater than the current value I1 of the current source 25b. Then, the hold capacitor 27 is charged with electric charge, and the peak detection signal Vpm increases. After a set-up time Tst elapses from the time T1, if peak voltages of the differential signal Vout and VoutB are referred to as Vpeak1, and a base-emitter voltage of the transistor 21a is referred to as Vbe1, the peak detection signal Vpm converges to a voltage which is calculated by Vpeak1−Vbe1. By the amplitude detection circuit 911, such a difference Vam−Vpm is generated based on the detection signals Vam and Vpm after the convergence. Furthermore, the amplitude detection circuit 911 detects a voltage of two times the difference as a voltage corresponding to an amplitude Vamp of the differential signal Vout and VoutB.

In addition, FIG. 8A, 8B illustrate an operation state of the amplitude detection circuit 911 in a short time which is the same as a signal period after the convergence, FIG. 8A illustrates a waveform of the emitter currents Ie1, Ie2 and Ie3 of each of the transistors 21a, 21b and 21c of the amplitude detection circuit 911, and FIG. 8B illustrates a waveform of the differential signal Vout and VoutB and the detection signals Vam and Vpm. The differential signal Vout and VoutB are non-return-to-zero (NRZ) signals.

The base-emitter voltages Vbe1, Vbe2 and Vbe3 of the transistors 21a, 21b and 21c are a voltage when an emitter current of the transistor 21a is on, a voltage when an emitter current of the transistor 21b is on, and a voltage when a steady emitter current of the transistor 21c is generated, respectively. Since the emitter currents have the same values, the voltages Vbe1, Vbe2 and Vbe3 are set to be the same value. As described above, the amplitude detection circuit 911 can detect the amplitude from the difference of the detection signals Vam and Vpm, and thus the amplitude can be accurately detected only in a state where the voltage Vbe1 is the same as the voltage Vb3. To that end, it is necessary to set in such a manner that the emitter currents Ie1, Ie2 and Ie3 are Ie1=Ie2=Ie3. In order to satisfy such a condition, the current values I1 and I3 of the current sources 25b and 25c are designed such that I1=I3. However, there is a case where by signal waveforms of the differential signal Vout and VoutB, a difference between the emitter current Ie1 and the current value I1 is great, and the condition described above is not satisfied. As a result, the accuracy of amplitude detection tends to decrease.

Figure 9A:
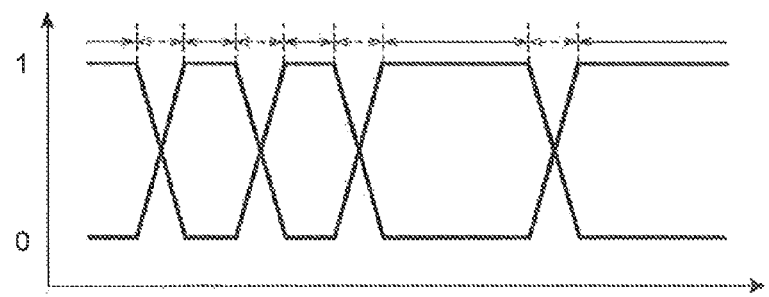
FIG. 9A is a waveform diagram illustrating an example of signal waveforms of the differential signal Vout and VoutB as a binary NRZ signal.
Figure 9B:
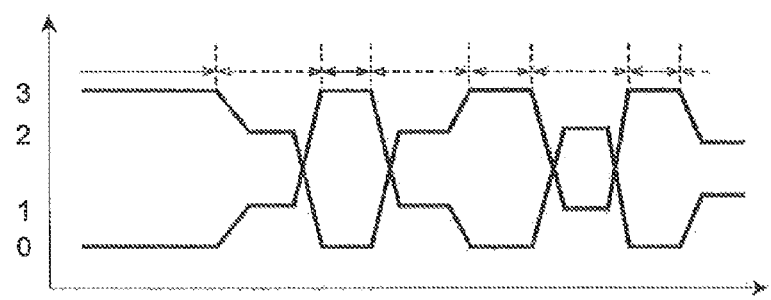
FIG. 9B is a waveform diagram illustrating an example of signal waveforms of the differential signal Vout and VoutB as a signal with four values.
Figure 9C:
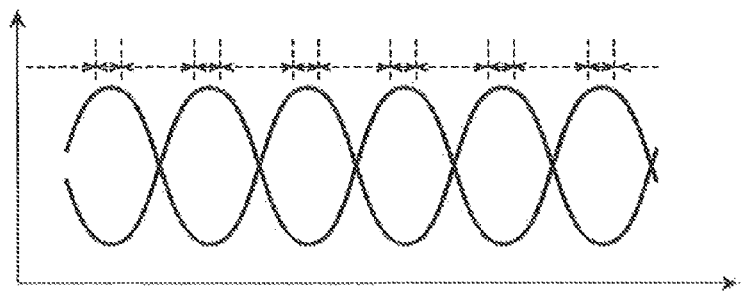
FIG. 9C is a waveform diagram illustrating an example of signal waveforms of the differential signal Vout and VoutB as a SIN function signal.

For example, as an example of the signal waveforms of the differential signal Vout and VoutB, the waveforms illustrated in FIGS. 9A to 9C are assumed. In the figures, the time (on-time) while the transistor 21a or the transistor 21b is turned on is represented by "ON", and the time (off-time) while the transistor 21a and the transistor 21b are turned off is represented by "OFF".

The waveform illustrated in FIG. 9A illustrates a binary NRZ signal. However, in this case, only a short time at the time of signal transition becomes the off-time, the other time becomes the on-time, and thus a ratio of the off-time with respect to the entire time is small. The waveform illustrated in FIG. 9B illustrates signals with four values which are used for PAM4 and 16QAM. In this case, the times of values "1" and "2" are in an off-state. If occurrence ratios of "0", "1", "2" and "3" are the same, an off-time ratio with respect to the entire time becomes approximately 0.5. The waveform illustrated in FIG. 9C illustrates a SIN function signal as a representative example of an analog signal. In this case, since only a peak time is in an on-state, the off-time ratio with respect to the entire time becomes great. For example, it becomes off-time/(off-time+on-time) to 0.8.

If the amplitude detection circuit 911 detects the differential signal Vout and VoutB of the waveforms, the higher the off-time ratio becomes, the greater the increased amount of the emitter currents Ie1 and Ie2 from the current value I1 in an on-state of the transistors 21a and 21b becomes. As a result, there is a case where the voltages Vbe1 and Vbe2 of the transistors 21a and 21b become different from the voltage Vbe3 of the transistor 21c, and the accuracy of the detected amplitude based on the difference between the detection signals Vam and Vpm is significantly decreased. For example, in a case of the waveform illustrated in FIG. 9B, the on-time ratio with respect to the entire time is 0.5. So, at the time of turning on, the currents Ie1 and Ie2 are almost two times the current value I1. In addition, in a case of the waveform of FIG. 9C, the on-time ratio is approximately 0.2. So, at the time of turning on, the currents Ie1 and Ie2 are almost five times the current value I1.

In contrast to this, FIG. 4A, 4B, 4C illustrate the operation state of the amplitude detection circuit 11 according to the present embodiment in a short time which is approximately the same as the signal period after the convergence, FIG. 4A illustrates the waveform of the emitter currents Ie1, Ie2 and Ie3 of each of the transistors 21a, 21b and 21c of the amplitude detection circuit 11, FIG. 4B illustrates the waveform of the differential signal Vout and VoutB and the detection signals Vain and Vpm, and FIG. 4C illustrates the waveform of a current value Isw1 which is supplied to the differential circuit 23 from the current source 25b.

In this manner, when the differential signal Vout and VoutB are in peak potential, the switch 29 switches on, and when the differential signal Vout and VoutB do not rise to the peak potential, the switch 29 switches off. As a result, in the off-time illustrated in FIG. 9, the current Isw1 is off. As a result, an error of the voltage Vbe between the transistors 21a and 21b and the transistor 21c can be reduced, and an error of amplitude detection is reduced. In addition, on and off timing of the current Isw1 and on and off timing of the emitter currents Ie1 and Ie2 do not necessarily need to match. The ratios of on-time to off-time thereof may be set close together. From this viewpoint, a signal delay of the switch 29, the comparator 34, and the level sensing circuit 37 does not matter. Thus, it is possible to decrease power consumption of the circuit.

Figure 5:
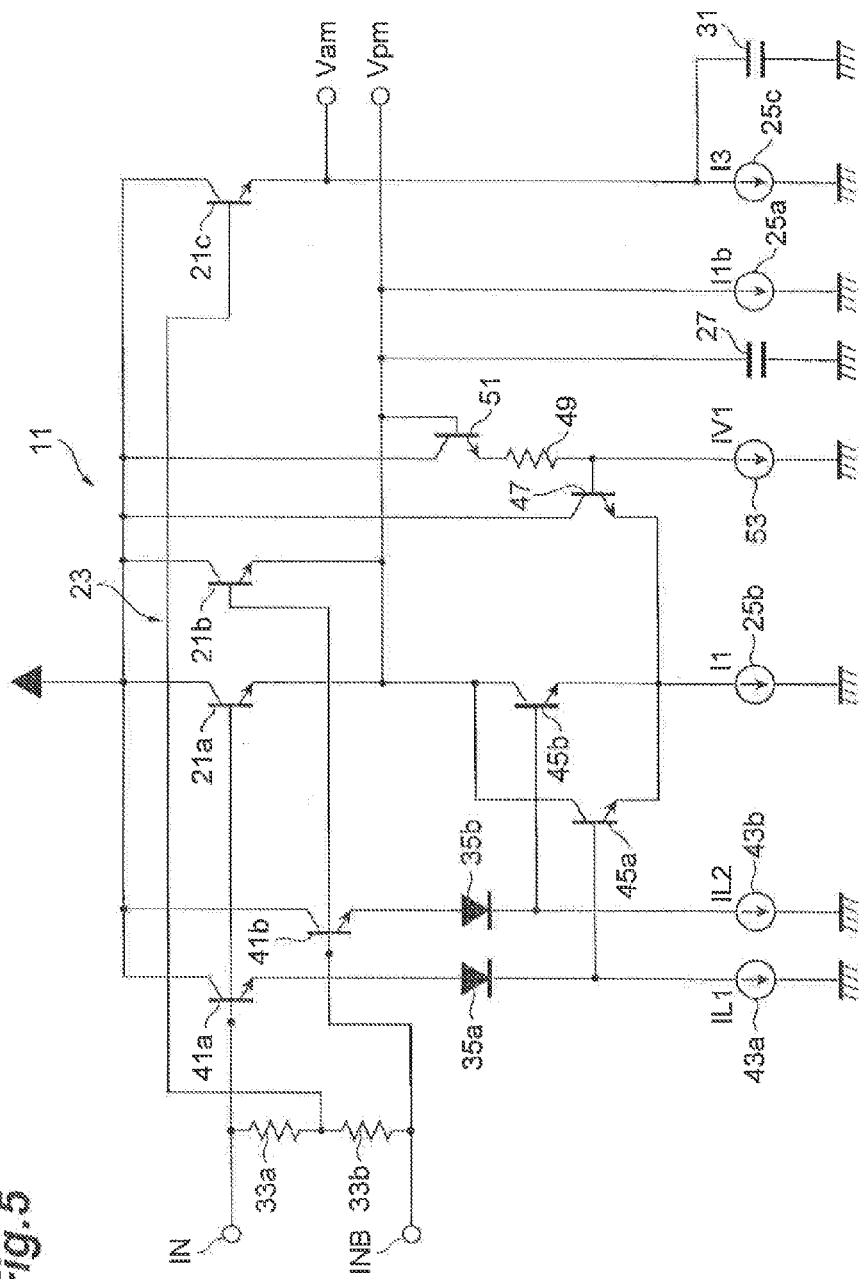
FIG. 5 is a circuit diagram illustrating a detailed configuration of the amplitude detection circuit 11 of FIG. 3.

Next, an example of the amplitude detection circuit 11 will be described. FIG. 5 is a circuit diagram illustrating a detailed configuration of the amplitude detection circuit 11.

In the amplitude detection circuit 11 illustrated in FIG. 5, anode terminals of the diodes 35a and 35b are connected to the input terminals IN and INB via emitter follower circuits 41a and 41b, respectively, which are configured with transistors. Cathode terminals of the diodes 35a and 35b are connected to the current sources 43a and 43b having current values IL1 and IL2, respectively. For example, the current values IL1 and IL2 are set to be in a range of 10 µA to 100 µA. As a result, a potential which is obtained by level-shifting the differential signal Vout and VoutB down by the amount of two diode forward voltage drops is generated in the cathode terminals of the diodes 35a and 35b, respectively.

In addition, by the transistors 45a and 45b, and a transistor 47, functions of the switch 29 and the comparator 34 are realized. Specifically, collector terminals of the transistors 45a and 45b are connected in common to the emitter terminals of the transistors 21a and 21b. Emitter terminals of the transistors 45a and 45b are connected in common to the current source 25b. Base terminals of the transistors 45a and 45b are connected to the cathode terminals of the diodes 35a and 35b, respectively. In addition, the collector terminal of the transistor 47 is biased, and the emitter terminal thereof is connected to the current source 25b. Furthermore, the detection signal Vpm is applied to the base terminal of the transistor 47 via a resistor 49 and an emitter follower circuit 51. A current source 53 with a current value Iv1 is connected to the base terminal of the transistor 47. The emitter follower circuit 51 is a transistor for branching the detection signal Vpm, and level-shifts the detection signal Vpm down by the amount of one diode forward voltage drop. The resistor 49 generates a voltage drop responding to the current supplied from the current source 53. Thereby, the resistor 49 generates the reference voltage Vref by adding the negative voltage −V1 to the detection signal Vpm. For example, the voltage V1 is set to approximately 50 mV. By such a configuration, two detection voltages from the diodes 35a and 35b are compared with the reference voltage Vref. Then, when at least one of the two detection voltages exceeds the reference voltage Vref, the current value Isw1 is turned on, and thereby is able to be set to Isw1=I1. Since the transistors 45a, 45b and 47 simply make the current value I1 with a small value of 10 µA to 100 µA, it is easy to perform an operation speed thereof at a high speed, and it is possible to operate with a communication speed of approximately 40 Gbps.

In general, in a differential peak hold circuit, it is essential to connect a current source for driving a differential circuit in addition to a capacitor for holding to emitters of a pair of differential transistors. Since nothing is connected between the capacitor and the current source, a constant discharge occurs from the capacitor. Then, if a signal with a high ratio of time during which a level of the signal does not rise to peak is given as an input signal, a ratio of the time in which a pair of the differential transistors turn on is decreased. As a result, an emitter current at the time of turning on becomes greater than the current value of the current source. Meanwhile, since the transistor of an averaging circuit always senses the average value of an input signal, an emitter current value thereof does not be influenced by the ratio of the time in which the input signal does not reach the peak thereof, and is equal to the current value of the current source. Thus, when a signal amplitude is detected by a difference between the peak hold value and the average detection value, an error occurs due to the ratio of the time that does not reach the peak.

In the amplitude detection circuit 11 according to the present embodiment, regardless of the ratio of the time that does not reach the peak, when the differential transistors which configure the peak hold circuit turn on, the emitter current becomes almost equal to the current value of the current source 25b. The reason is that since base potentials of the transistors 45a and 45b are less than the base potential of the transistor 47 during the time that does not reach the peak, the current of the current source 25b flows into the transistor 47, and the hold capacitor 27 does not discharge. In addition, a constant current flows out of the current source 25a, but the current value is set to a small value of approximately ⅒ of that of the current source 25b, and does not influence the emitter currents of the transistors 21a and 21b when they turn on. A function of the current source 25a is to decrease the Vpm potential, when the peak value of the input signal is changed from a high value to a low value. when the peak value of the input signal is changed from a certain high value to a lower value than that, and a longer time than the hold time of the peak hold circuit elapses, that is, when the Vpm potential is changed from a certain high potential to a certain low potential, an operation is considered. This corresponds to an operation at the time between a time axis T2 and T2+Tst of FIG. 7. In this case, it is necessary for Vpm to be decreased up to a potential corresponding to a low peak after the time Tst elapses. However, since during the time from T2 to T2+Tst, the Vpm potential is a higher potential than the peak value of the input signal, the base potential of the transistor 47 is always in a state of a higher potential than the base potentials of the transistors 45a and 45b. Due to this, all of the current of the current source 25b flows into the emitter of the transistor 47, and does not contribute to the discharge of the capacitor 27 for holding. However, the current of the current source 25a constantly discharges the capacitor 27, thereby decreasing the Vpm potential. After the time T2+Tst, the capacitor 27 starts to be discharged by the current of the current source 25b in the same time ratio as the time ratio in which the input signal reaches a peak. the current of the current source 25b is in equilibrium with a charging current by means of the transistors 21a and 21b which are turned on, and the Vpm potential converges towards a certain value. In this manner, even if the peak of the input signal is changed from a high value to a low value, it is possible to track a hold level.

As described above, preferred embodiment according to the present invention is illustrated and described, but the present invention is not limited to the specific embodiment described above. That is, it is understood by those skilled in the art that within a range of the gist of the present invention described in the scope of appended claims, various modifications and changes can be made.

What is claimed is:

1. A detection circuit configured to detect a peak value of an input differential signal and detect an amplitude of the input differential signal based on the peak value, comprising:

a differential circuit including a pair of differential transistors configured to receive the input differential signal and a first current source, the pair of the differential transistors having a common output terminal connected to the first current source;

a hold capacitor connected between the common output terminal and a reference potential for generating a hold potential corresponding to the peak value;

a level sensing circuit configured to sense a voltage level of the input differential signal and output a switching signal based on the voltage level; and a switch configured to receive the switching signal and electrically connect the common output terminal and a second current source when the switching signal exceeds a threshold level being lower than the hold potential by a predetermined amount, and electrically disconnect the common output terminal and the second current source when the switching signal stays lower than the threshold level.

2. The detection circuit according to claim 1, further comprising:
an averaging circuit configured to sense an average value of the input differential signal,
wherein the amplitude of the input differential signal is detected by a difference between the hold potential and the average value.

3. The detection circuit according to claim 2,
wherein a current source for driving the averaging circuit is configured to drain the same current value as a current value of the second current source.

4. The detection circuit according to claim 3,
wherein the averaging circuit includes a transistor receiving an average potential of the input differential signal, and size of the transistor of the averaging circuit is equal to size of the pair of the differential transistors.

5. A detection circuit configured to detect a peak value of an input signal and detect an amplitude of the input signal based on the peak value, comprising:

a transistor configured to receive the input signal and output a current from an output terminal to a parallel circuit configured with a first current source and a hold capacitor;

a level sensing circuit configured to sense a voltage level of the input signal and output a switching signal based on the voltage level; and a switch configured to receive the switching signal and electrically connect the output terminal and a second current source when the switching signal exceeds a threshold level being lower than a hold potential by a predetermined amount, and electrically disconnect the common output terminal and the second current source when the switching signal stays lower than the threshold level.

6. The detection circuit according to claim 5,
wherein a current value of the first current source is smaller than a current value of the second current source.

7. The detection circuit according to claim 5, further comprising:
a comparator configured to compare the voltage level of the input signal with the threshold level and output the switching signal.

* * * * *